United States Patent
Zakel et al.

(10) Patent No.: US 8,256,131 B2
(45) Date of Patent: Sep. 4, 2012

(54) METHOD AND DEVICE FOR DRYING CIRCUIT SUBSTRATES

(75) Inventors: Elke Zakel, Falkensee (DE); Ghassem Azdasht, Berlin (DE)

(73) Assignee: Pac-Tech—Packaging Technologies GmbH, Nauen (DE)

(*) Notice: Subject to any disclaimer, the term of this patent is extended or adjusted under 35 U.S.C. 154(b) by 1099 days.

(21) Appl. No.: 10/582,421

(22) PCT Filed: Dec. 22, 2004

(86) PCT No.: PCT/DE2004/002827
§ 371 (c)(1),
(2), (4) Date: Aug. 7, 2008

(87) PCT Pub. No.: WO2005/062358
PCT Pub. Date: Jul. 7, 2005

(65) Prior Publication Data
US 2008/0282574 A1    Nov. 20, 2008

(30) Foreign Application Priority Data
Dec. 22, 2003   (DE) ................................. 103 61 075

(51) Int. Cl.
*F26B 3/30* (2006.01)
(52) U.S. Cl. ............. 34/77; 34/78; 134/1.3; 134/104.2
(58) Field of Classification Search ............. 34/77, 78, 34/80, 90, 201, 210, 242, 266; 134/1.3, 104
See application file for complete search history.

(56) References Cited

U.S. PATENT DOCUMENTS

| | | | | |
|---|---|---|---|---|
| 3,610,912 A | * | 10/1971 | Schwartz | 362/261 |
| 3,878,816 A | * | 4/1975 | Harris et al. | 399/241 |
| 3,953,265 A | * | 4/1976 | Hood | 438/8 |
| 4,021,110 A | * | 5/1977 | Pundsack | 399/140 |
| 4,021,278 A | * | 5/1977 | Hood et al. | 438/8 |
| 4,085,398 A | * | 4/1978 | Bertram et al. | 338/25 |
| 4,341,590 A | * | 7/1982 | Nelson et al. | 117/66 |
| 4,343,013 A | * | 8/1982 | Bader et al. | 347/47 |

(Continued)

FOREIGN PATENT DOCUMENTS

EP   1016738 A2 *   7/2000

(Continued)

OTHER PUBLICATIONS

PCT International Search Report, International Application No. PCT/DE2004/002827; International Filing Date, Dec. 22, 2004; mailing date, Jun. 10, 2005 (6 pp.).

*Primary Examiner* — Stephen M. Gravini
(74) *Attorney, Agent, or Firm* — McGlew and Tuttle, P.C.

(57) ABSTRACT

Method and device for drying circuit substrates (13), in particular semiconductor substrates, in which a circuit surface (30) of the circuit substrate is flushed using a flushing liquid (10) in a flushing step and the circuit surface is dried in a subsequent drying step, the circuit substrate being moved in the flushing step in the direction of its planar extension transversely and in relation to a liquid level (28) of the flushing liquid in such a way that a liquid meniscus forms at a transition area between the circuit surface and the liquid level, which changes because of the relative movement, and thermal radiation (36) is applied to the transition area wetted by the liquid meniscus in the drying step.

18 Claims, 1 Drawing Sheet

U.S. PATENT DOCUMENTS

| | | | |
|---|---|---|---|
| 4,443,411 A * | 4/1984 | Kalejs | 117/211 |
| 4,545,650 A * | 10/1985 | Kirkman et al. | 359/272 |
| 4,892,857 A * | 1/1990 | Tennent et al. | 502/439 |
| 5,096,670 A * | 3/1992 | Harris et al. | 422/65 |
| 5,145,646 A * | 9/1992 | Tyranski | 422/547 |
| 5,439,782 A * | 8/1995 | Haemmerle et al. | 430/321 |
| 5,556,479 A | 9/1996 | Bran et al. | |
| 5,644,475 A * | 7/1997 | Woychik et al. | 361/767 |
| 5,650,122 A * | 7/1997 | Harris et al. | 422/81 |
| 5,660,642 A * | 8/1997 | Britten | 134/30 |
| 5,739,296 A * | 4/1998 | Gvon et al. | 534/577 |
| 5,779,912 A * | 7/1998 | Gonzalez-Martin et al. | 210/748.14 |
| 5,793,390 A * | 8/1998 | Claflin et al. | 347/33 |
| 5,840,862 A * | 11/1998 | Bensimon et al. | 536/22.1 |
| 5,846,770 A * | 12/1998 | LaVallie et al. | 435/69.1 |
| 5,965,209 A * | 10/1999 | Komatsu et al. | 427/430.1 |
| 5,965,403 A * | 10/1999 | Celeste et al. | 435/69.4 |
| 5,985,166 A * | 11/1999 | Unger et al. | 216/97 |
| 5,986,056 A * | 11/1999 | LaVallie et al. | 530/350 |
| 6,027,917 A * | 2/2000 | Celeste et al. | 435/69.1 |
| 6,042,224 A * | 3/2000 | Oda et al. | 347/86 |
| 6,054,327 A * | 4/2000 | Bensimon et al. | 436/518 |
| 6,108,932 A * | 8/2000 | Chai | 34/245 |
| 6,117,337 A * | 9/2000 | Gonzalez-Martin et al. | 210/748.14 |
| 6,128,829 A * | 10/2000 | Wolke et al. | 34/259 |
| 6,136,186 A * | 10/2000 | Gonzalez-Martin et al. | 210/198.1 |
| 6,139,613 A * | 10/2000 | Hendrickson et al. | 106/415 |
| 6,156,211 A * | 12/2000 | Gonzalez-Martin et al. | 204/157.9 |
| 6,174,394 B1 * | 1/2001 | Gvon et al. | 156/100 |
| 6,203,660 B1 * | 3/2001 | Unger et al. | 156/345.11 |
| 6,225,055 B1 * | 5/2001 | Bensimon et al. | 435/6 |
| 6,265,153 B1 * | 7/2001 | Bensimon et al. | 435/6 |
| 6,303,296 B1 * | 10/2001 | Bensimon et al. | 435/6 |
| 6,328,814 B1 * | 12/2001 | Fishkin et al. | 134/30 |
| 6,331,612 B1 * | 12/2001 | Celeste et al. | 530/350 |
| 6,336,710 B1 * | 1/2002 | Silverbrook | 347/54 |
| 6,357,846 B1 * | 3/2002 | Kitahara | 347/10 |
| 6,399,396 B1 * | 6/2002 | Bass | 436/180 |
| 6,409,928 B1 * | 6/2002 | Gonzalez et al. | 210/748.14 |
| 6,455,209 B1 * | 9/2002 | Okaniwa et al. | 430/7 |
| 6,492,251 B1 * | 12/2002 | Haba et al. | 438/612 |
| 6,492,493 B2 * | 12/2002 | Celeste et al. | 530/350 |
| 6,508,528 B2 * | 1/2003 | Yamazaki et al. | 347/9 |
| 6,527,370 B1 * | 3/2003 | Courian et al. | 347/47 |
| 6,539,956 B1 * | 4/2003 | Wolke et al. | 134/61 |
| 6,548,255 B2 * | 4/2003 | Bensimon et al. | 435/6 |
| 6,548,569 B1 * | 4/2003 | Williams et al. | 523/124 |
| 6,582,578 B1 * | 6/2003 | Dordi et al. | 205/80 |
| 6,593,690 B1 * | 7/2003 | McCormick et al. | 313/506 |
| 6,623,934 B2 * | 9/2003 | Celeste et al. | 435/7.1 |
| 6,629,997 B2 * | 10/2003 | Mansmann | 623/14.12 |
| 6,689,323 B2 * | 2/2004 | Fisher et al. | 422/504 |
| 6,696,644 B1 * | 2/2004 | Chiu et al. | 174/535 |
| 6,746,544 B2 * | 6/2004 | Fishkin et al. | 134/30 |
| 6,838,493 B2 * | 1/2005 | Williams et al. | 523/124 |
| 6,866,842 B1 * | 3/2005 | Chancellor et al. | 424/93.1 |
| 6,867,247 B2 * | 3/2005 | Williams et al. | 523/124 |
| 6,875,289 B2 * | 4/2005 | Christenson et al. | 134/36 |
| 6,880,919 B2 * | 4/2005 | Min et al. | 347/63 |
| 6,945,627 B2 * | 9/2005 | Yamaguchi | 347/27 |
| 6,964,685 B2 * | 11/2005 | Murray et al. | 623/13.17 |
| 6,986,980 B2 * | 1/2006 | Kubota et al. | 430/156 |
| 7,025,457 B2 * | 4/2006 | Trinh et al. | 351/177 |
| 7,045,018 B2 * | 5/2006 | Ravkin et al. | 134/6 |
| 7,093,375 B2 * | 8/2006 | O'Donnell | 34/79 |
| 7,122,126 B1 * | 10/2006 | Fuentes | 216/90 |
| 7,122,647 B2 * | 10/2006 | Bensimon et al. | 536/23.1 |
| 7,151,086 B2 * | 12/2006 | Celeste et al. | 514/8.8 |
| 7,153,633 B2 * | 12/2006 | Min et al. | 430/320 |
| 7,179,883 B2 * | 2/2007 | Williams et al. | 528/354 |
| 7,211,932 B2 * | 5/2007 | Bran | 310/328 |
| 7,252,098 B2 * | 8/2007 | Fishkin et al. | 134/66 |
| 7,268,205 B2 * | 9/2007 | Williams et al. | 528/354 |
| 7,268,469 B2 * | 9/2007 | Bran | 310/328 |
| 7,293,855 B2 * | 11/2007 | Silverbrook | 347/54 |
| 7,329,321 B2 * | 2/2008 | Yun et al. | 134/15 |
| 7,360,872 B2 * | 4/2008 | Silverbrook | 347/54 |
| 7,363,727 B2 * | 4/2008 | O'Donnell | 34/380 |
| 7,399,770 B2 * | 7/2008 | Schudok et al. | 514/301 |
| 7,401,405 B2 * | 7/2008 | Silverbrook | 29/890.1 |
| 7,401,890 B2 * | 7/2008 | Silverbrook | 347/29 |
| 7,401,910 B2 * | 7/2008 | Silverbrook | 347/92 |
| 7,429,537 B2 * | 9/2008 | Aegerter et al. | 438/745 |
| 7,443,597 B2 * | 10/2008 | Humpston | 359/665 |
| 7,465,041 B2 * | 12/2008 | Silverbrook | 347/85 |
| 7,518,288 B2 * | 4/2009 | Bran | 310/328 |
| 7,520,284 B2 * | 4/2009 | Boyd et al. | 134/57 R |
| 7,553,923 B2 * | 6/2009 | Williams et al. | 528/354 |
| 7,568,488 B2 * | 8/2009 | Yun et al. | 134/57 R |
| 7,594,934 B2 * | 9/2009 | Stone | 623/23.72 |
| 7,606,608 B2 * | 10/2009 | Blank et al. | 600/344 |
| 7,614,406 B2 * | 11/2009 | Bran | 134/1.3 |
| 7,706,080 B2 * | 4/2010 | Ohtake et al. | 359/687 |
| 7,754,291 B2 * | 7/2010 | Bree et al. | 427/427.3 |
| 7,754,425 B2 * | 7/2010 | Bensimon et al. | 435/6 |
| 7,798,678 B2 * | 9/2010 | Destain | 362/311.02 |
| 7,810,513 B1 * | 10/2010 | Boyd et al. | 134/104.2 |
| 7,857,430 B2 * | 12/2010 | Furukawa | 347/65 |
| 7,887,792 B2 * | 2/2011 | Chancellor et al. | 424/93.1 |
| 7,919,112 B2 * | 4/2011 | Pathak et al. | 424/426 |
| 2003/0188770 A1 | 10/2003 | Doi | |
| 2008/0282574 A1 * | 11/2008 | Zakel et al. | 34/266 |

FOREIGN PATENT DOCUMENTS

| | | |
|---|---|---|
| EP | 1039506 A2 * | 9/2000 |
| JP | 09133932 A * | 5/1997 |
| JP | 09-186127 | 7/1997 |
| JP | 09-283489 | 10/1997 |
| JP | 10-284459 | 10/1998 |
| JP | 10-321583 | 12/1998 |
| JP | 10321583 A * | 12/1998 |
| JP | 11-507121 | 6/1999 |
| JP | 2000-183021 | 6/2000 |
| JP | 2000173977 A * | 6/2000 |
| JP | 2002-134463 | 5/2002 |
| JP | 2003-303798 | 10/2003 |
| WO | WO 2004030051 A2 * | 4/2004 |
| WO | WO 2005062358 A1 * | 7/2005 |
| WO | WO 2007021654 A2 * | 2/2007 |

\* cited by examiner

METHOD AND DEVICE FOR DRYING CIRCUIT SUBSTRATES

This is a National Phase of International Application No. PCT/DE2004/002827, filed on Dec. 22, 2004, which claims priority from German Patent Application No. 103 61 075.8, filed on Dec. 22, 2003.

The present invention relates to a method for drying circuit substrates, in particular semiconductor substrates, in which a circuit surface of the circuit substrate is flushed using a flushing liquid in a flushing step and the circuit surface is dried in a following drying step. Furthermore, the present invention relates to a device for performing the above method.

Semiconductor wafers in particular, which are used for manufacturing chips, are provided before their separation into chips with a terminal surface structure which allows the later contacting of the chips and comprises the implementation of suitable contact metallizations on the terminal surfaces. For this purpose, chemical deposition techniques are typically used, which allow a layered buildup of the contact metallizations. In particular to avoid corrosion on the contact-side surfaces of the wafer and/or the chips produced therefrom through separation, it is necessary to perform cleaning of the terminal or circuit surface, in which ionic or anionic contaminants contaminating the surface, which result from the deposition procedures, are removed. For this purpose, flushing the terminal surface of the semiconductor substrate repeatedly using deionized water until only a permissible ion concentration is measurable in the flushing water is known.

It has been shown that in case of drying of the terminal surface following the flushing procedure, after evaporation of flushing water residues remaining on the terminal surface, corrosion pockets remain on the terminal surface.

Therefore, in the past, different efforts have been taken in order to allow drying of the terminal surface with as little residue as possible immediately following the flushing procedure. One of these possibilities is to apply a temperature to the circuit substrate after application of flushing liquid or after removal from a flushing bath in order to allow the most rapid and residue-free evaporation of the flushing water possible. However, this is associated with the disadvantage that the temperature strain accompanying the known drying frequently reaches or even exceeds the range of the temperature strain just permissible for perfect functioning of the circuit substrate. Furthermore, reducing the surface tension of the water through different measures in order to allow more rapid draining of the flushing water from the circuit surface with as little residue as possible is known. However, it has been established that the surfactants used as an additive to the flushing water for this purpose, for example, typically in turn cause residues on the terminal surface. Residues of this type may be avoided in the event of cleaning with the addition of alcohol, but the use of alcohol as a flushing liquid makes the supplementary use of frequently explosive materials necessary, so that performing methods of this type requires special explosion protection and is thus correspondingly costly.

The present invention is thus based on the object of suggesting a method and/or a device for performing a method which allows essentially residue-free cleaning of circuit substrates without too high a temperature strain of the circuit substrates and/or too high an outlay when performing the method and/or during operation of the corresponding device.

The above object is achieved by a method according to claim 1 and/or a device according to claim 7.

In the method according to the present invention, in which a circuit surface of the circuit substrate is flushed using flushing liquid in a flushing step and the circuit surface is dried in a subsequent drying step, the circuit substrate is moved in the flushing step in the direction of its planar extension, transversely and in relation to a liquid level of the flushing liquid, in such a way that at a transition area between the circuit surface and the liquid level, which changes because of the relative movement, a liquid meniscus is formed and in the drying step thermal radiation is applied to the transition area wetted by the liquid meniscus.

When the method according to the present invention is used, the circuit substrate has thermal radiation applied to it in a transition area wetted with the liquid meniscus, so that a temperature increase of the liquid meniscus, which causes evaporation, occurs in the circuit substrate via absorption of the thermal radiation. Since a part of the circuit substrate which changes, but is always more or less large, remains in the liquid bath during the application of temperature, heat is always dissipated from the circuit substrate into the liquid bath in parallel to the temperature application, so that overheating of the substrate may be precluded as much as possible. In addition, the application of temperature through thermal radiation allows essentially convection-free heating of the circuit substrate, so that contamination by contaminants carried along in a convection flow may be precluded as much as possible.

According to a preferred variation of the method, the thermal radiation is applied using an infrared radiator, so that heat may be introduced especially effectively into the circuit substrate.

A variation which is particularly advantageous in regard to the space required when performing the method is that to perform the relative movement between the liquid level and the circuit substrate, the circuit substrate is situated in the flushing liquid, which is received by a bath container, and the liquid level is lowered.

If the thermal radiation is applied transversely to the liquid level, it is possible to apply the thermal radiation simultaneously to multiple circuit substrates situated in a composite arrangement.

In addition, it has been shown to be especially advantageous if ventilation of a container lumen implemented above the liquid level occurs essentially parallel to the liquid level, since therefore subsequent condensation of the liquid evaporated in the area of the liquid meniscus on the circuit substrate may be prevented.

If multiple flushing steps are performed through repeated flooding of the container before performing the drying step in the bath container, the method allows not only a subsequent cleaning partial step in regard to residue-free drying of the terminal surfaces of circuit substrates, but rather additionally also performing preceding multiple flushing procedures with the goal of producing the ionic and/or anionic concentration on the circuit surfaces before the subsequent drying step in an overall continuous method in a single device.

The device according to the present invention for performing the method for drying circuit substrates, in particular semiconductor substrates, is provided with a bath container which has an intake unit and an outlet unit and in which a receiving system for receiving at least one circuit substrate is situated in such a way that the circuit substrate extends in a plane in the direction of a container floor. In addition, the device according to the present invention is provided with a cover unit which closes a container opening of the bath container and with a thermal radiator unit situated above the receiving system.

In an especially advantageous embodiment of the device, the thermal radiator unit is provided with infrared radiators.

If the thermal radiator unit is situated on the cover unit, simple positioning of the thermal radiator unit above the liquid level is possible, which allows simultaneous application to multiple circuit substrates received in the receiving system.

Furthermore, it is advantageous if the thermal radiator is situated above a transparent plate for separation from a container interior, so that the thermal radiator itself is situated in a protected way outside the aggressive atmosphere in the container interior.

If the bath container is provided in the area of the cover unit with a ventilation unit, the effectiveness of the device may be increased even further. It is especially advantageous for a simple design of the device if the ventilation unit is situated on the cover unit.

In the following, a preferred variant of the device according to the present invention and a device preferably usable for this purpose are explained in greater detail on the basis of the drawings.

Figure 1:
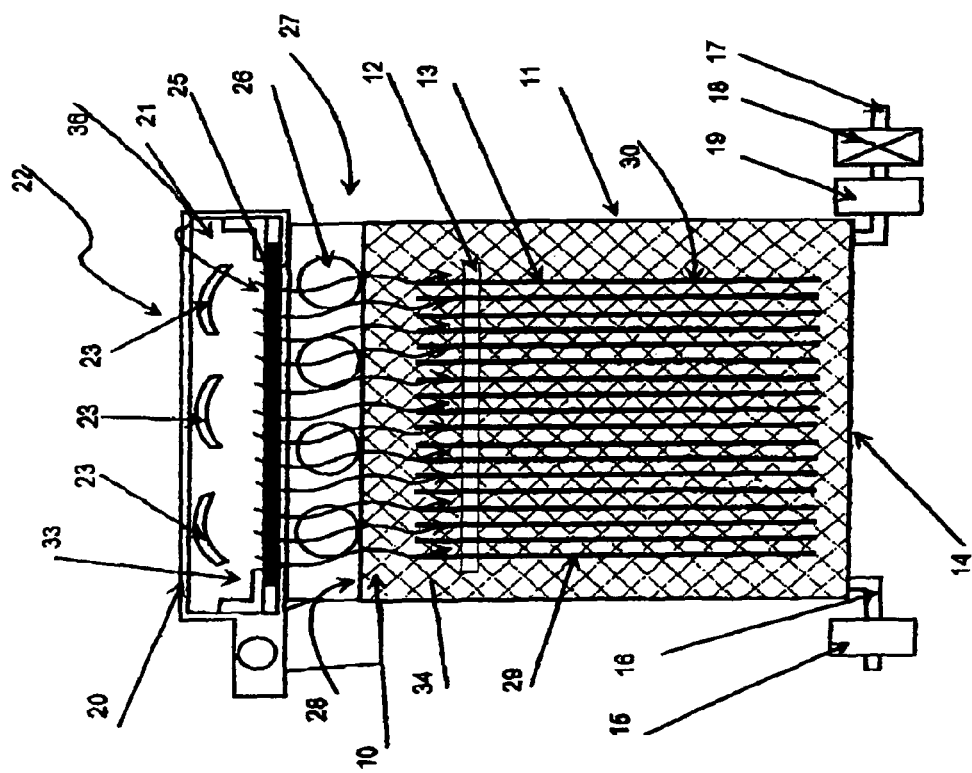
FIG. 1 shows a sectional illustration of a device for cleaning semiconductor substrates.

FIG. 1 shows a bath container 11, filled with a flushing liquid 10, which is formed in the present case by deionized water, in which a receiving system 12 having wafers 13 received uniformly distributed therein is situated. The receiving system 12 may have two clamping jaws which receive the wafers 13 between them around the peripheral edge, for example, so that the wafer surfaces remain freely accessible.

The bath container 11 is provided in the area of its container floor 14 with an inflow unit 16 provided with an inlet valve 15. Furthermore, an outflow unit 17 is provided in the area of the container floor 14, which has an outlet valve 18. In addition, the outflow unit 17 is equipped with a flow valve 19 that allows setting of the flow velocity of the flushing liquid 10 flowing out through the outflow unit 17.

In the area of the container opening 24 of the container floor 11 situated diametrically opposite the container floor 14 and which allows insertion and removal of the wafer 13 situated in the receiving system 12, a cover unit 20 closing the container opening 24 is situated, which allows operation of the bath container 11 as a processing chamber closed in relation to the environment.

The cover unit 20 is implemented in the present case like a housing having a cover interior 21, in which a thermal radiator unit 22 having thermal radiators 23 in the present case comprising multiple infrared radiators is received. To avoid heat buildup, the cover unit 20 may be provided with ventilation (not shown in greater detail here). A cover wall 25 situated directly opposite the container opening 24 is transparent and implemented in the present case as a glass plate 25 inserted into the cover unit 20. A ventilation unit 27 having multiple ventilation channels 26 running parallel to the plane of the container opening 24 is located situated neighboring the container opening 24 and above a liquid level 28 of the bath container 11, shown in the completely flooded state in FIG. 1. The ventilation channels 26 discharge in the present case from the outside into a rear container wall 34 of the bath container 11 and allow supply and removal of a ventilation flow directed parallel to the liquid level 28 and having a very low flow velocity.

For operation of the device shown in FIG. 1, the receiving system 12 having the wafers 13 received therein is inserted into the bath container 11 and the bath container 11 is closed using the cover unit 20. In a subsequent filling procedure, the bath container 11, with outlet valve 18 of the outflow unit 17 closed, is flooded with flushing liquid 10 through the inflow unit 16 until reaching a liquid level 28 shown in FIG. 1, which completely covers the wafers 13 extending toward the container floor 14.

Figure 2:
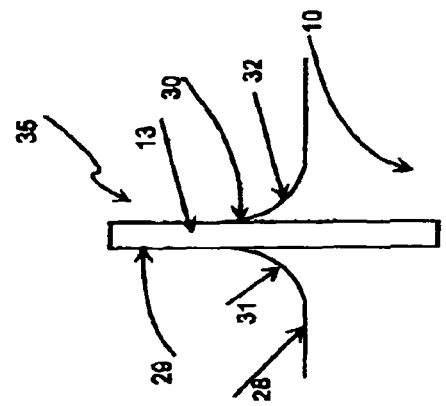
FIG. 2 shows an enlarged illustration of a liquid meniscus implemented between a liquid level and a circuit surface of the semiconductor substrate.

Proceeding from the flooded state of the bath container 11 shown in FIG. 1, with open flow valve 19, the liquid level 28 is now preferably continuously lowered, so that a progressively larger part of the wafers 13 projects out of the flushing liquid 10. As the liquid level 28 is reduced, a liquid meniscus 31, 32 forms in a transition area 35 between the surfaces 29, 30 of the wafers 13 running transversely to the liquid level 28 and the liquid level 28, as shown in FIG. 2. At least one of the surfaces 29, 30 is implemented as a circuit surface having contact metallizations situated thereon.

As the liquid level 28 is lowered, the thermal radiator unit 22, which emits IR radiation in the present exemplary embodiment, is in operation using the thermal radiators 23, which are separated from the liquid level 28 by the glass plate 25. As a result of the absorption of the thermal radiation 36 in the semiconductor material of the wafers 13, the part of the wafers 13 situated above the liquid level 28 is heated, while in contrast the part of the wafers 13 situated in the flushing liquid 10 is relatively cooled by the heat transfer between the semiconductor material and the flushing liquid 10. This prevents overheating of the semiconductor material, which impairs the function of the wafer, from being able to occur in spite of the fact that heating of the semiconductor material is sufficient for evaporation of the flushing liquid 10 in the area of the liquid meniscus 31, 32. Through the evaporation of the flushing liquid 10 in the area of the liquid meniscus 31, 32, it is ensured that essentially no residues of flushing liquid remain on the surfaces 29, 30 of the wafers 13. In addition to the evaporation of the flushing liquid in area of the liquid meniscus 31, 32, the surface tension of the liquid meniscus is also reduced through the heating of the semiconductor material in the area of the liquid meniscus 31, 32, so that the wetting properties of the flushing liquid 10 are increased in area of the surface meniscus 31, 32 and better drainage of the flushing liquid 10 from the surfaces 29, 30 is achieved.

The thermal transition, which is essentially restricted to the boundary area between the surfaces 29, 30 of the wafer 13 and the liquid meniscus 31, 32, ensures that heating and reduction of the surface tension of the flushing liquid associated therewith only occurs in the above-mentioned boundary area, so that adjacent thereto, the surface tension of the flushing liquid is essentially maintained and drops are prevented from forming in the area of the liquid meniscus 31, 32. This advantageous effect is also supported by the selection of a lowering speed of the liquid level 28 which allows a contact time between the surfaces 29, 30 of the wafer 13 and a liquid meniscus 31, 32 sufficient to achieve the above-mentioned effects.

Proceeding from the flooded state of the bath container 11 illustrated in FIG. 1, a lumen 33 formed between the liquid level 28 and the glass plate 25 becomes continuously larger as the liquid level 28 is reduced. In order to prevent flushing liquid 10 evaporated as a result of the application of thermal radiation 36 from condensing above the liquid level 28 on the surfaces 29, 30 of the wafer 13 again after cooling, the lumen 23 is ventilated by the ventilation unit 27.

The invention claimed is:

1. A method for drying circuit substrates, in particular semiconductor substrates, the method comprising:
providing a receiving system, said receiving system receiving at least one circuit substrate;
flushing a circuit surface of the at least one circuit substrate using a flushing liquid in a flushing step;
providing a thermal radiator unit; and
drying the circuit surface in a subsequent drying step, the at least one circuit substrate being moved in the flushing step in the direction of its planar extension transversely and in relation to a liquid level of the flushing liquid in such a way that a liquid meniscus forms at a transition area between the circuit surface and the liquid level, which changes because of the relative movement, and thermal radiation is applied to the transition area wetted by the liquid meniscus in the drying step via said thermal radiator unit, said thermal radiator unit being arranged at a position above said receiving system and the circuit substrate.

2. The method according to claim 1, wherein said thermal radiator unit comprises an infrared radiator.

3. The method according to claim 1, wherein to perform the relative movement between the liquid level and the circuit substrate, the circuit substrate is situated in the flushing liquid received by a bath container and the liquid level is lowered.

4. The method according to claim 1, wherein thermal radiation is applied transversely to the liquid level.

5. The method according to claim 1, wherein multiple flushing steps are performed through repeated flooding of the bath container before performing the drying step in a bath container.

6. A device for performing a method for drying circuit substrates, in particular semiconductor substrates, the device comprising:
  a bath container, which is provided with an inflow unit and an outflow unit and is closable using a cover unit, wherein the bath container is provided with a ventilation unit in an area of the cover unit;
  a receiving system, which is situated in the bath container, for receiving at least one circuit substrate in such a way that the circuit substrate extends in a plane in the direction of a container floor of said bath container; and
  a thermal radiator unit situated above the receiving system so as to allow simultaneous application to multiple circuit substrates arranged in said receiving system.

7. The device according to claim 6, wherein the thermal radiator unit is provided with infrared radiators.

8. The device according to claim 6, wherein the thermal radiator unit is situated on the cover unit.

9. The device according to claim 6, wherein the thermal radiator unit is situated above a transparent plate for separation from a container interior.

10. The device according to claim 6, wherein the ventilation unit is situated on the cover unit.

11. A method in accordance with claim 1, further comprising:
  providing a bath container, said receiving system being arranged in said bath container, said flushing liquid being provided in said bath container, wherein said drying step includes decreasing a level of said flushing liquid in said bath container and applying said thermal radiation to said transition area as said level of said flushing liquid is decreased.

12. A method in accordance with claim 1, further comprising:
  providing a bath container, said receiving system being arranged in said bath container, said flushing liquid being provided in said bath container, wherein said drying step includes decreasing an amount of said flushing liquid in said bath container such that at least a portion of said at least one circuit substrate is located at a spaced location from said flushing liquid and at least another portion of said at least one circuit substrate is in contact with said flushing liquid.

13. A device in accordance with claim 6, wherein a fluid is provided in said bath container, said fluid being at a first fluid level with said outflow unit in a closed state, said fluid being at a second fluid level with said outflow unit in an open state, said first fluid level being greater than said second fluid level, one or more of said circuit substrates being located at a position below said first fluid level with said outflow unit in said closed state, said one more of said circuit substrates having at least one portion located at a spaced location from said flushing liquid and at least another portion in contact with said flushing liquid with said outflow unit in said open state, said thermal radiation unit applying thermal radiation to said one more of said circuit substrates with said outflow unit in the open state.

14. A method, comprising:
  providing at least one circuit substrate in a receiving system, said at least one circuit substrate comprising a circuit surface;
  providing a fluid holding structure, said receiving system with said at least one substrate being arranged in said fluid holding structure;
  providing a fluid;
  delivering said fluid to said fluid holding structure such that said fluid is provided at or above a surface of said receiving system;
  providing a thermal radiator unit, said thermal radiator unit being arranged at a position above said receiving system and said at least one circuit substrate;
  decreasing an amount of said fluid in said fluid holding structure after delivering said fluid to said fluid holding structure; and
  drying said circuit surface with said thermal radiator unit after or during said step of decreasing said amount of said fluid.

15. A method in accordance with claim 14, wherein a liquid meniscus forms at a transition area between the circuit surface and a fluid level of said fluid after decreasing said amount of fluid in said fluid holding structure, said at least one circuit substrate being moved in a direction of a planar extension thereof, said direction of said planar extension being transverse to said fluid level, wherein thermal radiation is applied to the transition area wetted by the liquid meniscus in the drying step via said thermal radiator unit.

16. A method in accordance with claim 14, wherein an amount of said fluid in said bath container is decreased such that at least a portion of said at least one circuit substrate is located at a position above a level of said fluid and at least another portion of said at least one circuit substrate is in contact with said fluid.

17. A method in accordance with claim 14, wherein thermal radiation is applied to said transition area via said thermal radiation unit as said amount of said fluid is decreased.

18. A method in accordance with claim 14, wherein said fluid holding structure is connected to an inflow unit and an outflow unit, said fluid being at a first fluid level with said outflow unit in a closed state, said fluid being at a second fluid level with said outflow unit in an open state, said first fluid level being greater than said second fluid level, said at least one circuit substrate being located at a position below said first fluid level with said outflow unit in said closed state, said at least one circuit substrate having at least one portion located at a spaced location from said flushing liquid and at least another portion in contact with said flushing liquid with said outflow unit in said open state, said thermal radiation unit applying thermal radiation to said at least one circuit substrate with said outflow unit in the open state.

* * * * *